United States Patent [19]

Murahashi

[11] Patent Number: 5,677,712

[45] Date of Patent: Oct. 14, 1997

[54] SEMICONDUCTOR DEVICE

[75] Inventor: Shunichi Murahashi, Nabari, Japan

[73] Assignee: Sharp Kabushiki Kaisha, Osaka, Japan

[21] Appl. No.: 301,420

[22] Filed: Sep. 9, 1994

Related U.S. Application Data

[63] Continuation-in-part of Ser. No. 813,393, Dec. 27, 1991, abandoned.

[30] Foreign Application Priority Data

Jan. 8, 1991 [JP] Japan .................................. 3-579

[51] Int. Cl.$^6$ .................................................. G09G 5/00
[52] U.S. Cl. ......................... 345/205; 345/87; 345/206; 349/149
[58] Field of Search ........................ 345/87, 204, 205, 345/202, 206; 349/149, 150, 151, 152

[56] References Cited

U.S. PATENT DOCUMENTS

| | | |
|---|---|---|
| 3,668,688 | 6/1972 | Schmersal . |
| 3,701,123 | 10/1972 | Barrett et al. ........................ 345/205 |
| 4,613,855 | 9/1986 | Person et al. . |
| 4,640,581 | 2/1987 | Nakanowatari et al. . |
| 4,684,974 | 8/1987 | Matsunaga . |
| 4,740,782 | 4/1988 | Aoki et al. . |
| 5,025,348 | 6/1991 | Suzuki et al. . |
| 5,361,079 | 11/1994 | Yamamoto ........................... 345/206 |
| 5,406,312 | 4/1995 | Arimoto ............................... 345/206 |

*Primary Examiner*—Richard H. Jerpe
*Assistant Examiner*—Xiao M. Wu
*Attorney, Agent, or Firm*—Nixon & Vanderhye P.C.

[57] ABSTRACT

A semiconductor device for driving a display element, which has a display plane and is disposed adjacent to the semiconductor device such that the semiconductor device is positioned at the periphery of the display plane, is provided with a substrate having an oblong shape which extends along one side of the display plane opposing to the semiconductor device. The semiconductor device is also provided with a plurality of wiring patterns formed on the substrate. Each of the wiring patterns extends in a direction intersecting the longitudinal direction of the substrate, and is electrically connected to the display element at one end thereof at one side of the substrate opposing to the display element. The semiconductor device is further provided with an IC chip for driving the display element. The IC chip has an oblong shape and is mounted on the substrate, such that the longitudinal direction of the IC chip is parallel to the longitudinal direction of the substrate. The IC chip includes a plurality of pads, which are electrically connected to another end of the wiring patterns to output driving signals via the wiring patterns to the display element and are arranged in a row along the longitudinal direction of the IC chip.

12 Claims, 3 Drawing Sheets

SEMICONDUCTOR DEVICE

CROSS-REFERENCE TO RELATED APPLICATION

This application is a continuation-in-part of application Ser. No. 813,393, filed Dec. 27, 1991, now abandoned, for SEMICONDUCTOR DEVICE.

BACKGROUND OF THE INVENTION

1. Field of the Invention

The present invention relates to a semiconductor device, more particularly, a semiconductor device, which can be suitably utilized as a driving device for a display apparatus such as a liquid crystal display apparatus, so as to miniaturize such a display apparatus.

2. Description of the Related Arts

In order to miniaturize the construction of a certain kind of electronics apparatus such a liquid crystal display apparatus, an EL (Electroluminescence) display device, a portable type electronics apparatus and so on, it is desirable to reduce the installation area of a semiconductor device i.e. a liquid crystal driving device for example, which includes an IC (Integrated Circuit) chip and is disposed adjacent to the liquid crystal display element, and at the same time not to reduce the area for the liquid crystal display plane in the plane delineation of the pertinent liquid crystal display apparatus. By such a miniaturization manner, a relatively wide display plane can be kept in a relatively small construction of the display apparatus.

In order to reduce such a installation area for the liquid crystal driving device, one related art is proposed, in which a TCP (Tape Carrier Package) is employed for the liquid crystal driving device.

In this related art display apparatus, the liquid crystal driving device is provided with a tape substrate of the TCP and an IC chip, which is mounted on the tape substrate and includes a control circuit and an array of a plurality of liquid crystal driving circuits. The liquid crystal driving circuits are connected to display electrodes of the liquid crystal display element via wiring patterns formed on the tape substrate, such that the liquid crystal driving circuits drive the liquid crystal display element under the control of the control circuit.

Here, the IC chip has a substantially square plane shape in general, and is provided with a plurality of connecting electrodes, to connect the liquid crystal driving circuits to the wiring patterns respectively, i.e. a plurality of pads for outputting the driving signals from the driving circuits. Here, these pads are arranged on the IC chip by a predetermined pitch along the peripheral portion of the IC chip.

In this related art display apparatus, the slits are formed into the tape substrate, and the tape substrate is folded at the slits when it is connected to the liquid crystal display element and thus installed in the liquid crystal display apparatus, so that the installation area for the IC chip i.e. the liquid crystal driving device occupies a relatively small area with respect to the display plane of the liquid crystal display element in its plane delineation, as a result.

In this manner, according to the above-mentioned related art display apparatus, the installation area of the driving device i.e. the TCP, can be reduced by the folded construction of the tape substrate, so that the area of the display plane can be kept relatively large in its plane delineation, and at the same time, the whole construction of the liquid crystal display apparatus can be miniaturized to some extent.

There is another related art liquid crystal display apparatus, which employs the TCP for the driving device without folding it.

In this another related art display apparatus, the TCP on which the IC chip is mounted, is not folded and is connected to the liquid crystal display element at the side thereof. Here, the IC chip constructing the liquid crystal driving device mounted on the TCP, has in general a substantially square shape in its plane delineation as aforementioned. Thus, if the plane area of the IC chip is assumed to be constant, the peripheral length of the IC chip having such a square plane shape, is shorter than that of an imaginary IC chip having an oblong plane shape, for example.

As a result, in order to effectively reduce the installation area of this TCP, which is disposed adjacent to the liquid crystal element, if the length of the TCP were to be made longer in a direction along one side of the liquid crystal display element opposed to the TCP, and shorter in a direction perpendicular to this one side, the pitch width of the pads of the IC chip, which are to be arranged along the thus shortened side of the TCP, should be correspondingly narrowed to a certain extent. Thus, the area for the curved path of the wiring patterns around the IC chip on the tape substrate necessary for the appropriate electrical connections of the IC chip, would become inevitably large in this case.

In this manner, as a matter of fact, it is difficult to make the TCP into a slim shape in its plane delineation, and thus, it is difficult to reduce the installation area of the TCP without folding it.

Additionally it is generally desirable to make the installation process of the semiconductor device easy and reliable with low cost.

However, according to the aforementioned related art in which the TCP is folded, since it is necessary to form the slits, the manufacturing processes are increased by the slit forming process and the TCP folding process, while the manufacturing cost is also increased by the TCP material cost as well as the increased processes.

On the other hand, according to the aforementioned related art in which the TCP is not folded, the manufacturing process is rather easy, but the TCP cannot be essentially made slim, resulting in the difficulty of reducing the installation area of the TCP so as to improve the effective miniaturization of the apparatus.

SUMMARY OF THE INVENTION

It is therefore an object of the present invention to provide a semiconductor device, which can be easily installed to a display apparatus, a portable type electronics apparatus etc., and is suitable for the miniaturization of such apparatuses by effectively reducing its installation area.

According to the present invention, the above mentioned object can be achieved by a semiconductor device for driving a display element, which has a display plane and is disposed adjacent to the semiconductor device such that the semiconductor device is positioned at the periphery of the display plane. The semiconductor device is provided with a substrate having an oblong shape which extends along one side of the display plane opposite the semiconductor device. The semiconductor device is also provided with a plurality of wiring patterns formed on the substrate. Each of the wiring patterns extends in a direction intersecting the longitudinal direction of the substrate, and is electrically connected to the display element at one end thereof at one side of the substrate opposite the display element. The semiconductor device is further provided with an IC chip for driving the display element. The IC chip has an oblong shape and is mounted on the substrate, such that the longitudinal direction of the IC chip is parallel to the longitudinal direction of the substrate. The IC chip includes a plurality of pads, which are electrically connected to another end of the wiring patterns to output driving signals via the wiring patterns to the display element and are arranged in a row along the longitudinal direction of the IC chip.

According to the semiconductor device of the present invention, the pitch width of the pads arranged in a row on the IC chip, can be made relatively wide since the IC chip has an oblong shape extending in a longitudinal direction parallel to one side of the display plane while the pads are arranged in this longitudinal direction. In other words, enough of the pads can be furnished on the IC chip without the difficulty of distributing the pads with a fine pitch, at the side of the IC chip opposite the display element. This construction of the IC chip, in turn, allows the substrate to be made in a long and narrow shape without increasing the area for the curved path of the wiring patterns around the IC chip on the substrate necessary for the appropriate electrical connections of the IC chip. Accordingly, the installation area for the semiconductor device as a driving device, can be reduced in a quite efficient manner, and that, this installation area occupies only the narrow width area along the periphery of the display plane.

Consequently, the display plane can be made relatively large while the whole construction of the display apparatus, which is composed of the semiconductor device and the display element, can be efficiently miniaturized. Further, according to the present invention, since there is no need to make a slit in the substrate or fold the substrate, the manufacturing process can be quite simplified with low cost.

Further objects and advantages of the present invention will be apparent from the following description of the preferred embodiment of the invention as illustrated in the accompanying drawings.

DETAILED DESCRIPTION OF THE PREFERRED EMBODIMENT

A preferred embodiment of the present invention will be described below with reference to the accompanying drawings.

Figure 1:
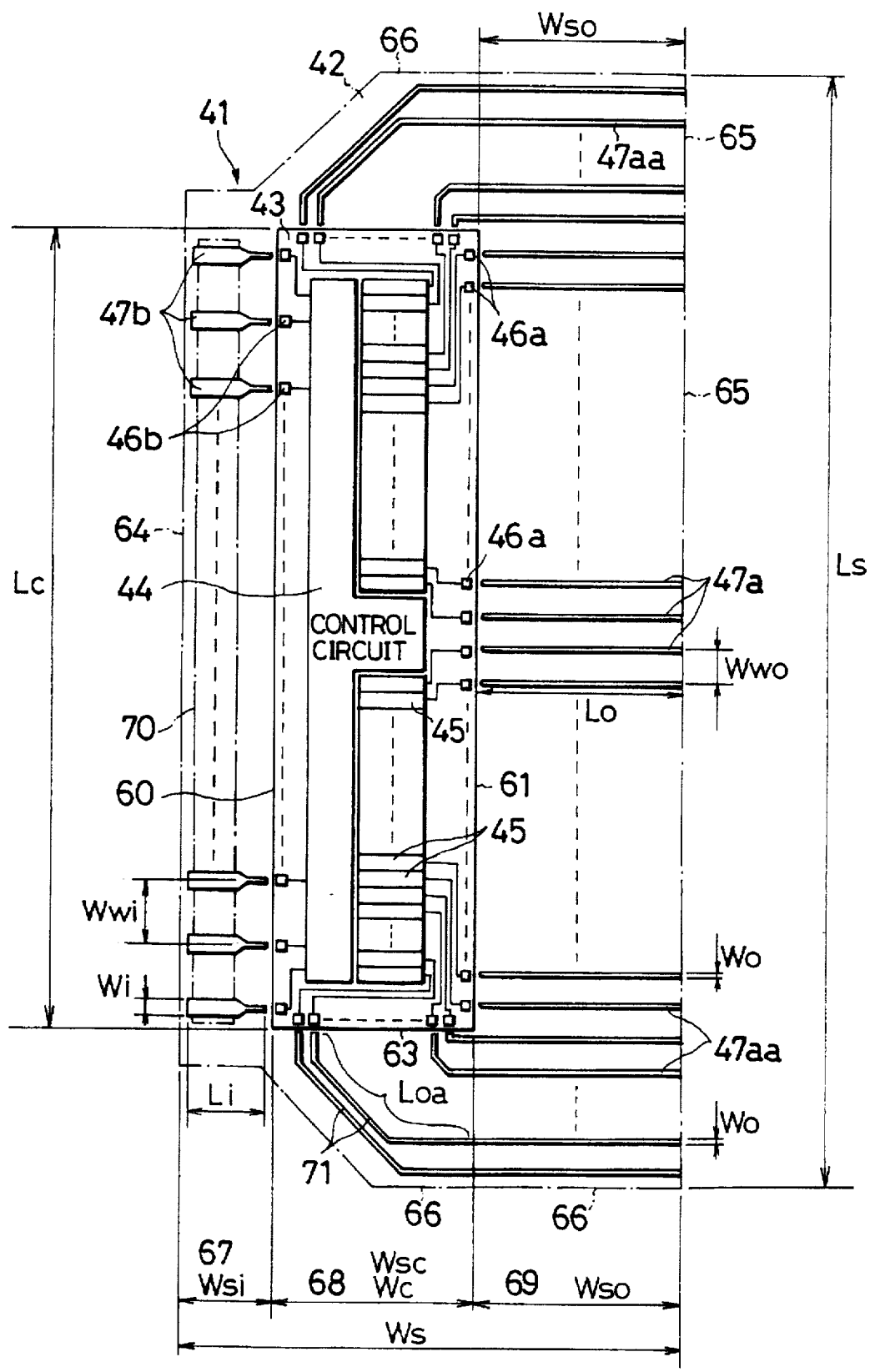
FIG. 1 is a schematic plan view of a semiconductor device of TCP type as one embodiment of the present invention.

In FIG. 1, a semiconductor device 41 of TCP type is provided with a tape substrate 42, which is made of polyimide film for example, and a liquid crystal driving IC chip 43, which is mounted on the tape substrate 42.

The IC chip 43 includes a control circuit 44 and a plurality of liquid crystal driving circuits 45 which are arranged in a row.

Each of the liquid crystal driving circuits 45 is to be connected to one of a plurality of display electrodes of a liquid crystal display element (not shown in FIG. 1) via wiring patterns 47a, which are formed on the tape substrate 42.

The control circuit 44 is connected to wiring patterns 47b for inputting image signals. The wiring patterns 47b are to be connected to an image signal supplying device (not shown). The control circuit 44 is adapted to control the liquid crystal driving circuits 45 in correspondence with the image signals inputted via the wiring patterns 47b. Under this control of the control circuit 44, each of the liquid crystal driving circuits 45 drives the liquid crystal display element via the wiring patterns 47a.

As shown in FIG. 1, the tape substrate 42 is formed in an oblong shape in its plan delineation, wherein the wiring patterns 47a are arranged such that each of the wiring patterns 47a extends transversely in a direction intersecting the longitudinal direction of the tape substrate 42.

The IC chip 43 is also provided with a plurality of pads 46a for outputting driving signals from the liquid crystal driving circuits 45, and a plurality of pads 46b for inputting the image signals from the wiring patterns 47b. The pads 46a electrically connect the wiring patterns 47a to the liquid crystal driving circuits 45, and are arranged on the IC chip 43 along its peripheral portion at the right, upper and lower sides in the figure, by a predetermined pitch.

The pads 46b electrically connect the wiring patterns 47b to the control circuit 44, and are arranged on the IC chip 43 along its peripheral portion at the left side in the figure, by a predetermined pitch.

Figure 3:
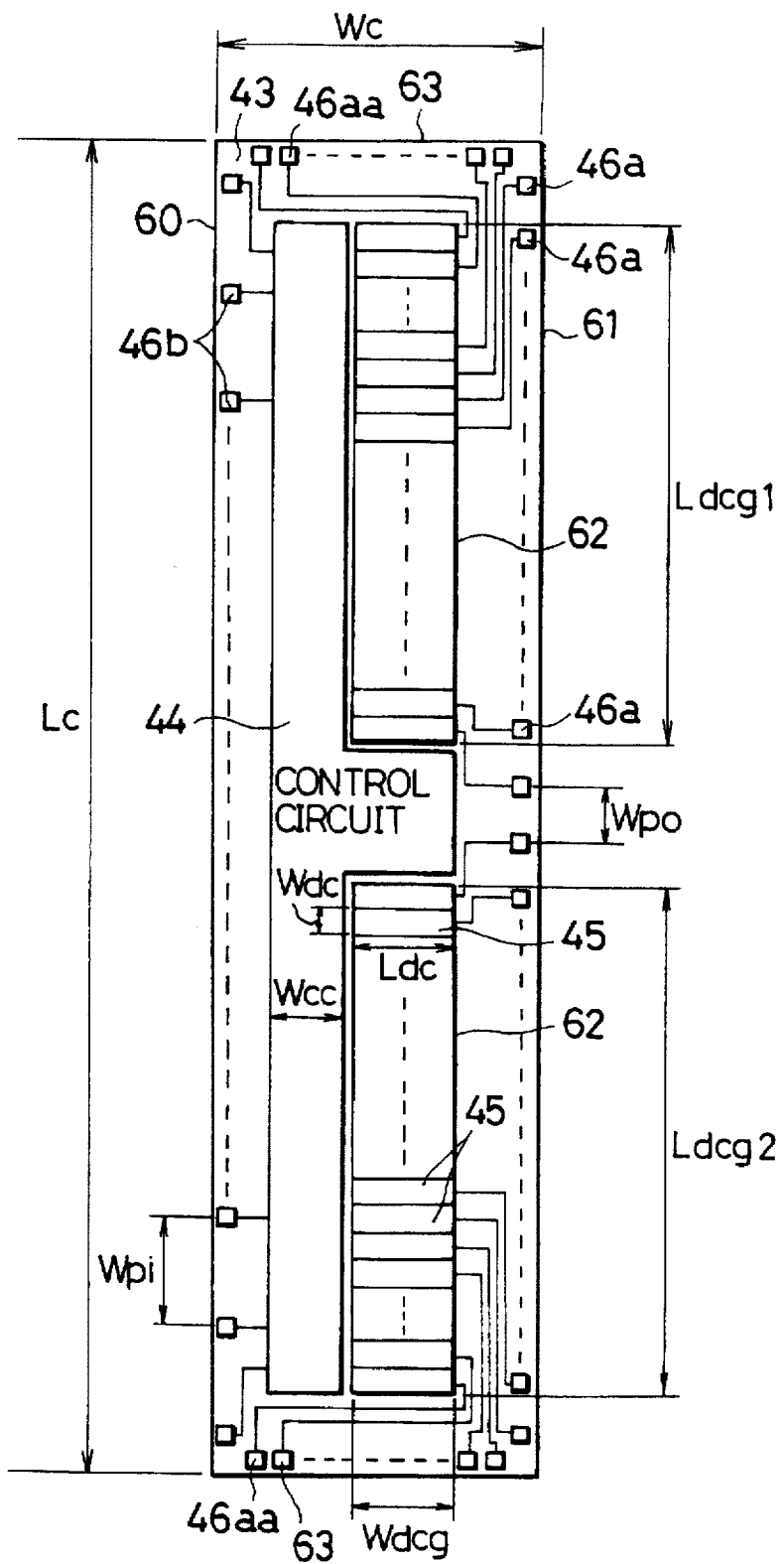
FIG. 3 is an enlarged schematic plane view of IC chip mounted on the semiconductor device of FIG. 1.

Hereinafter, the IC chip 43 and the single film substrate 42 will be described in more detail by referring to FIGS. 1 and 3.

The liquid crystal driving IC 43 is of an elongated rectangular shape, and has a chip length Lc and a chip width Wc. The two opposite sides along the chip length Lc are called the chip input side 60 and the chip output side 61, while the two opposite sides along the chip width Wc are called the chip intermediate sides 63.

Input pads (array) 46b are formed with a substantially constant input pad pitch Wpi adjacent to and substantially parallel to the chip input side 60, while output pads (array) 46a are formed with a substantially constant output pad pitch Wpo adjacent to and substantially parallel to the chip output side 61.

Because the number of output terminals is much greater than the number of input terminals (typically, the number of output terminals is several times or much greater than the number of input terminals, for example, 80 to 160 output terminals compared to 20 to 30 input terminals), the output pad pitch Wpo is arranged so as to be smaller than the input pad pitch Wpi.

Each of the liquid crystal driving circuits 45 forms a liquid crystal driving circuit section with a driving circuit width Wdc along the chip length Lc and a driving circuit length Ldc along the chip width Wc. The driving circuit width Wdc is formed so as to be smaller than the output pad pitch Wpo in such a manner that the driving circuit width Wdc of essentially all of the liquid crystal driving circuits 45 is opposite to the output side 61 and adjacent to the output pad array 46a in parallel.

Because the driving circuit width Wdc of all of the liquid crystal driving circuits 45 is formed opposite to the output side 61, essentially all of the liquid crystal driving circuits 45 can be formed in one array in parallel with the driving circuit width Wdc.

A number of liquid crystal driving circuits 45 arranged in parallel forms a liquid crystal driving circuit array section 62 adjacent and parallel to the output pad array 46a. The liquid crystal driving circuit array section 62 may be a single section or divided into a plurality of sections (in this invention, the two upper and lower sections as shown), but it is important that it be formed as a single array opposite to the output side in parallel.

The liquid crystal driving circuit array section 62 has a driving circuit array section length Ldcg (Ldcg 1 and Ldcg 2 because there are two upper and lower sections in the figure) along the chip length Lc, and a driving circuit array section width Wdcg along the chip width Wc.

The liquid crystal driving circuit array section 62 forms the liquid crystal driving circuits 45 in a single array parallel to the driving circuit width Wdc so that the driving circuit array section width Wdcg essentially matches the driving circuit length Ldc. Therefore, the driving circuit array section width Wdcg would be minimized in the direction of the chip width Wc.

In addition, the driving circuit width Wdc is to be formed smaller than the output pad pitch Wpo so that the sum of the driving circuit array section length Ldcg along the chip length Lc (Ldcg 1+Ldcg 2 in the figure) is smaller than the chip length Lc so as to form a margin between the liquid crystal driving circuit array section 62 and the control circuit 44, and the chip intermediate side 63. Additional output pads (array) 46aa may be formed substantially parallel and adjacent to the chip intermediate side 63 in this margin to further increase the density of the integration of the liquid crystal driving IC chip 43. Additional input pads (array) may be added to the margin as required.

The control circuits 44 are uniformly distributed and are formed essentially as a single array between the input pads (array) 46b adjacent and parallel to the input side 60 and the liquid crystal driving circuit array section 62 adjacent and parallel thereto as long as possible along the chip length Lc from the liquid crystal driving circuit at one end of the liquid crystal driving circuit array section 62 along the driving circuit array section length Ldcg to the one at the other end so that the width (control circuit width Wcc), which is necessary along the chip width Wc in addition to the driving circuit array section width Wdcg, can be minimized.

Even if the control circuit 44 is partially extended into the liquid crystal driving circuit array section 62 for formation (such as the projection to the right at the center in the figure), it does not widen the chip width Wc and so no inconvenience occurs.

The liquid crystal driving circuit array section 62 and the control circuits 44 are formed in a single array, respectively, parallel and adjacent each other, the driving circuit array section width Wdcg and the control circuit width Wcc are minimized, respectively, to make their sum (Wdcg+Wcc) essentially constant so that the entire chip width Wc can be minimized.

The liquid crystal driving circuit array section 62 may be further extended by providing more liquid crystal driving circuits 45 in parallel to make the ratio of the chip length Lc to the chip width Wc (Lc/Wc) four or more (ratio in the figure).

When a single elongated rectangular IC chip with a width minimized to the limit is assembled on the film substrate, the width of the film substrate can be reduced in response to the single IC chip so that a semiconductor device with a narrow width can be realized.

When such a semiconductor device is connected and mounted as a driving device for a display, it is possible to reduce the width of mounting area of the display so that a display with a high area efficiency can be attained.

The single film substrate 42 is essentially of a rectangular shape which has a substrate length Ls and a substrate width Ws.

The two opposite sides along the substrate length Ls are called the substrate input side 84 and the substrate output side 65, while the two opposite sides along the substrate width Ws are called the substrate intermediate sides 66. The substrate input side 64 and the substrate intermediate side 66 appropriately form an inclined cut at the corner where they directly intersect.

The film substrate 42 may be divided into a substrate input section 67, a chip mounting section 68, and a substrate output section 69, all of which are connected into a single film. The width of each section along the chip width Wc is called the substrate input section width Wsi, the chip mounting section width Wsc (equal to the chip width Wc), and the substrate output section width Wso.

An input wiring array 47b consisting of a plurality of input wiring 47b is linearly embedded and formed on the substrate input side 64 on the substrate input section 67 with an input wiring width Wi, and an input wiring pitch Wwi (with a value close to the value of the input pad pitch Wpi, but not necessarily completely matching it, and suitably determined). The input wiring array 47b connects an external electrode (not shown in the figure) at its wide section.

The substrate input section 67 may be provided with a slit 70 as required. Because the slit 70 is formed in such a manner that it is embedded in the film substrate 42 with a constant width from its outer periphery, and completely surrounded by the film substrate 42, which is a continuous single film, the strength of the film substrate 42 can be maintained substantially as is. In addition, because the input wiring (array) 47b is supported by a continuous single film substrate 42 at each of its ends, the mechanical strength can be sufficiently assured and there is no possibility of deformation.

The chip mounting section 68 is mounted with the liquid crystal driving IC chip 43 by alignment to the center of the chip length Lc. Ordinarily, the liquid crystal driving IC chip 43 is mounted on or embedded in the surface of the film substrate 42 at an area corresponding to the chip mounting section 68. The figure shows such a type of mounting schematically.

An output wiring array 47a consisting of a plurality of output wiring 47a and additional output wiring 47aa, which are parallel to each other, and an additional output wiring array 47aa are embedded and formed on the substrate output side 65 in the substrate output section 69 with an output wiring width Wo, and an output wiring pitch Wwo (with a value close to the value of the output pad pitch Wpo, but not necessarily completely matching it, and suitably determined), and an output wiring length Lo. The output wiring pitch Wwo is formed so as to be equal to the pitch of the corresponding display electrodes (not shown in the figure), which is predetermined by the display:

The output wiring length Lo is substantially equal to the substrate output section Wso, but not limited to such a value. The additional output wiring array 47aa connected to the additional output pads 46aa of the liquid crystal driving IC chip 43 forms an output wiring extension section 71 between the chip intermediate side 63 and the substrate intermediate side 66 in the chip mounting section 68, and has an output wiring extension length Loa in addition to the output wiring length Lo.

Because the chip width Wc is made to be minimum, the output wiring extension length Loa can be minimized accordingly so that the increase in wiring resistance can be suppressed at the area corresponding to the output wiring extension length Loa. Thus, the variation in the wiring resistance in the output wiring array 47a and the additional output wiring array 47aa is reduced to decrease the effect of the wiring resistance on the display. In addition, when the output wiring extension length Loa is made to be approximately the output wiring length Lo or less, the variation in the wiring resistance can be suppressed with certainty to a constant value or less.

Because the output wiring array 47a and the additional wiring array 47aa are closely formed on the surface of the substrate output section 69 having a continuous flat surface, the mechanical strength of the output wiring array 47a and the additional wiring array 47aa depends on the mechanical strength of the film substrate 42 regardless of their thin output wiring width Wo so that sufficient strength can be maintained and there is no possibility of deformation.

The output wiring length Lo is sufficient enough to have a length for assuring mechanical bonding strength and electrical connection conductivity with the electrode of the display (not shown in the figure). Because substantially the entire length of the substrate output section width Wso is used for connection, sufficient mechanical bonding strength can be obtained even with a short output wiring length Lo so that the output wiring length Lo can be shortened to its minimum limit.

Because the output wiring array 47a and the additional output wiring array 47aa have a number of wires far greater than that of the input wiring (array) 47b (several times or more as in the liquid crystal driving IC chip 43), it is possible to make the input wiring pitch Wwi larger than the output wiring pitch Wwo so that the input wiring width Wi can be formed so as to be wider than the output wiring width Wo.

As the input wiring width Wi can be formed to have a larger width, the mechanical bonding strength and the electrical connection conductivity of the input wiring (array) 47b to an external electrode (not shown in the figure) can be assured as in the cases of the output wiring array 47a and the additional output wiring array 47aa even when the input wiring length Li is formed shorter than the output wiring length Lo so that the substrate input section width Wsi can be further shortened.

Each end opposite to the chip input side 60 of the input wiring array 47b contacts each corresponding input pad 46b, while each end opposite to the chip output side 61 of the output wiring array 47a contacts each corresponding output pad 46a so that it is desired that each pitch be substantially the same.

It is possible to reduce the substrate width Ws of the single film substrate 42 by mounting the liquid crystal driving IC chip 44 with the minimum chip width on the single film substrate 42 with the substrate input section width and the substrate output section width, both of which have been reduced.

Figure 2:
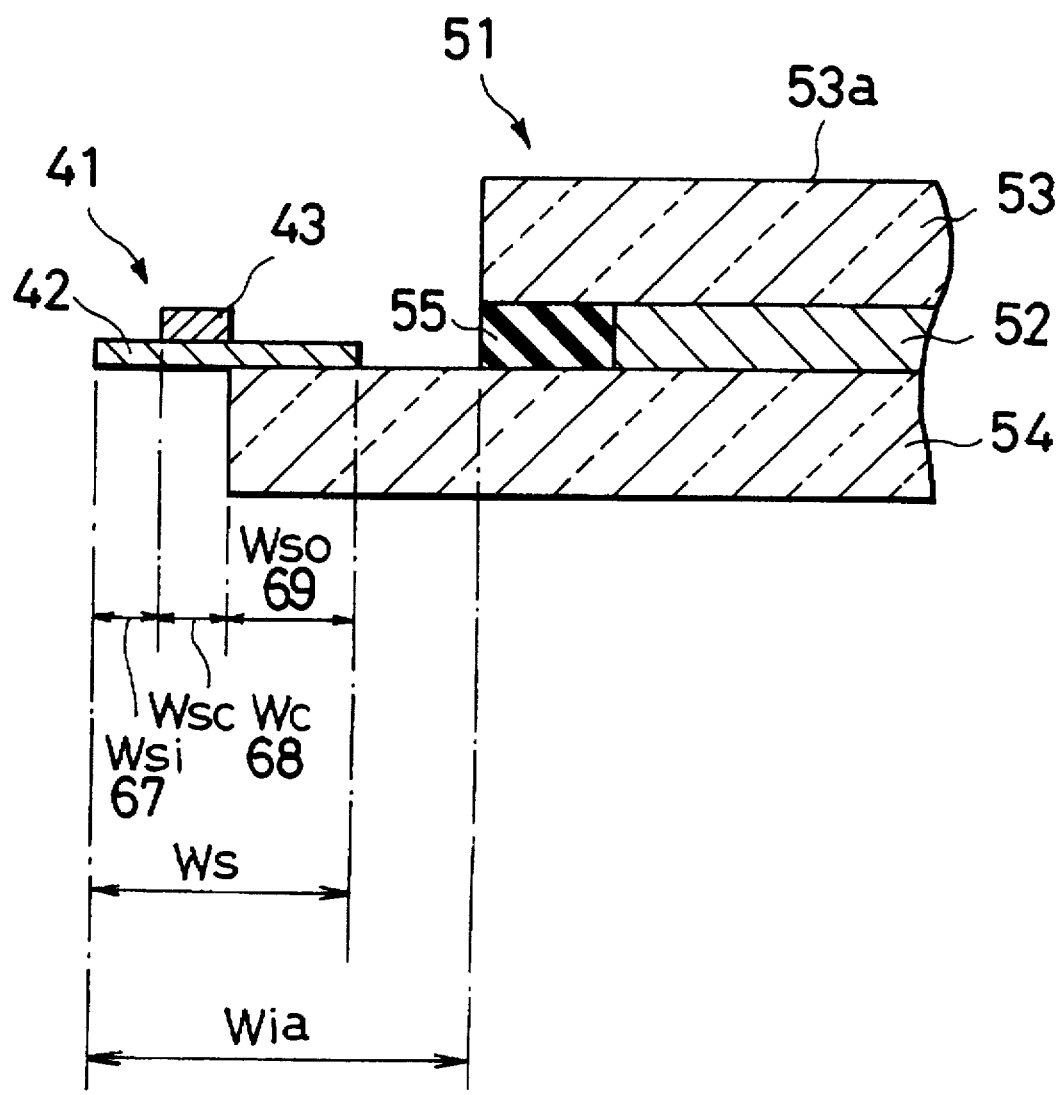
FIG. 2 is a schematic cross sectional view showing a portion of a liquid crystal display apparatus installed with the semiconductor device of FIG. 1.

FIG. 2 shows the configuration of a liquid crystal display apparatus including the above explained semiconductor device 41 of TCP type, and a liquid crystal display element 51 which is driven by the semiconductor device 41.

In FIG. 2, the liquid crystal display element 51 is provided with a liquid crystal layer 52 and a pair of glass substrates 53 and 54. The liquid crystal layer 52 is sealed by a sealing member 55 to form a liquid crystal cell. The liquid crystal display element 51 is also provided with orientation films, display electrodes, a dielectric film etc. (not shown), to enable a liquid crystal display operation of the apparatus.

The semiconductor device 41 of TCP type, is disposed adjacent to the liquid crystal display element 51 at the vicinity of one side of a liquid crystal display plane 53a of the liquid crystal display element 51. The display electrodes of the liquid crystal display element 51, are electrically connected to the wiring patterns 47a in FIG. 1 of the semiconductor device 41, by means of wire-less bonding technique, for example.

The tape substrate 42 is attached to the edge portion of the lower glass substrate 54, which is slightly wider than the upper glass substrate 53. Accordingly, in this liquid crystal display apparatus, the liquid crystal element 51 is adapted to be driven by the semiconductor device 41 of TCP type, or more particularly, by the IC chip 43 on the basis of the image signals inputted to the semiconductor device 41.

As can be seen from FIGS. 1 and 2, the IC chip 43 is especially made in an oblong rectangular shape in its plan delineation. More particularly, when the semiconductor device 41 of TCP type is installed to the liquid crystal element 51, the IC chip 43 is long in a direction along one side of the liquid crystal display element 51 opposite the IC chip 43, and is short in a direction perpendicular to this direction along one side.

Here, in order to construct the IC chip 43 in such a long and narrow rectangular shape, the liquid crystal driving circuits 45 are especially arranged on the IC chip 43 in a row, in the longitudinal direction of the IC chip 43. Further, as the internal wires of the IC chip 43, multi-layered metal wires may be employed so as to achieve an even longer and narrower configuration of the IC chip 43. In this embodiment, the control circuit 44 itself is also especially formed in an oblong shape in its plane delineation extending in the longitudinal direction of the IC chip 43 so as to allow the long and narrow configuration of the IC chip 43.

At the same time, the film substrate 42 i.e. the semiconductor device 41, is also made in a long and narrow rectangular shape in its plan delineation as can be seen from FIG. 1. Namely, the semiconductor device 41 of TCP type is made in such an oblong shape to be long in a direction along the longitudinal direction of the IC chip 43 i.e. along the opposing side of the liquid crystal display element 51, and to be short in a direction perpendicular to this longitudinal direction of the IC chip 43.

Here, the peripheral length of the IC chip 43 in its plan delineation, which has such an oblong rectangular shape, is much longer than that of the aforementioned conventional IC chip having a square shape, if the area is assumed to be constant. As a result, the pads 46a can be arranged in a row along this relatively long peripheral portion, by a relatively wide pitch width.

In the present embodiment, especially, the pitch width of the pads 46a, is selected to be about the same as the pitch width of the terminal portions of the wiring patterns 47a which are arranged parallel to each other, so that the area for the curved path of the wiring patterns 47a around the IC chip 43 on the tape substrate 42 necessary for the appropriate electrical connections of the IC chip 43, can be made extremely small. This brings a great advantage of a compact design around the liquid crystal display element 51.

As described in detail, enough of the pads 46a can be furnished on the IC chip 43 without the difficulty of distributing the pads with a fine pitch, at the side of the IC chip 43 opposite the liquid crystal display element 51. This construction of the IC chip 43, in turn, allows the substrate 42 to be made in a long and narrow shape without increasing the area for the curved path of the wiring patterns 47a around the IC chip 43 on the substrate 42 necessary for the appropriate electrical connections of the IC chip 43.

Consequently, since the semiconductor device 41 can be made in a long and narrow rectangular shape, the installation area for the semiconductor device 41 can be made effectively small, when it is installed in the liquid crystal display apparatus at the side of the display plane 53a, as can be seen from FIG. 2, so that the area of the display plane 53a can be kept relatively large while the whole construction of the liquid crystal display apparatus can be efficiently miniaturized.

In the above described embodiment, though the semiconductor device 41 employs the tape substrate 42, other type of substrate may be utilized for the semiconductor device 41 instead of the tape substrate 42a, as long as the shape of the IC chip 43 and the shape of the substrate etc., satisfy the above explained conditions.

A semiconductor device with a width reduced to the minimum is provided by assembling a single elongated rectangular IC chip with a width reduced to the minimum on a rectangular film substrate with a width reduced to the minimum in a similar manner.

When this semiconductor device is connected and mounted as a driving device for a display, it is possible to reduce the width of the mounting section of the finally obtained display, that is the mounting section width (Wia), to the minimum limit so that a display with a higher ratio of actual display area to the area of the entire display can be implemented.

As for the display, a liquid crystal display with a large screen having a number of display electrodes is particularly suitable. Therefore, when it is applied to a liquid crystal display, it is possible to implement a display which is thin and has a small surrounding contour area compared to the actual display area, which provides a significant advantage.

When a number of liquid crystal driving circuits 45 is further mounted in parallel, a further longer semiconductordevice can be provided, which significantly reduces the number of semiconductor devices to be mounted as driving devices when compared to a display with the same display area as a reference, thus making the manufacture of a display easy.

Further, in the above described embodiment, the semiconductor device 41 of TCP type is embodied as the liquid crystal driving device, it can be also utilized as a driving device for the EL display apparatus or for the portable electronics apparatus in which the driving device is requested to be installed in a limited internal area, with the benefit that the effective miniaturization is realized with a relatively small cost.

Many widely different embodiments of the present invention may be constructed without departing from the spirit and scope of the present invention. It should be understood that the present invention is not limited to the specific embodiments described in this specification, except as defined in the appended claims.

What is claimed is:

1. A semiconductor device being connected to a display electrode surrounding a display for driving the display, and comprising:

(a) a single film substrate which is substantially a rectangular shape, and which has
   a substrate input side and a substrate output side on its longer side, a substrate intermediate side on its shorter side, and
   a substrate input section, a chip mounting section and a substrate output section substantially in parallel between said substrate input side and said substrate output side,
   an input wiring array comprising a plurality of input wiring contained inside with respect to the substrate input side and being formed on the surface of said substrate input section,
   an output wiring array comprising a plurality of output wiring contained inside with respect to the substrate output side and being formed on the surface of said substrate output section, with the pitch of said input wiring array larger than that of said output wiring array, and with the wiring width of said input wiring larger than that of said output wiring, (b) a single IC chip mounted on said chip mounting section in parallel with the longer side of said substrate, said chip being rectangular in shape, having a chip input side and a chip output side on its longer side, and a chip intermediate side on its shorter side, and comprising:
   an input pad array adjacent and parallel to said chip input side and having a substantially constant input pad pitch,
   an output pad array adjacent and parallel to said chip output side and having a substantially constant output pad pitch smaller than said input pad pitch,
   a driving circuit array including a plurality of driving circuits with a pitch smaller than said output pad pitch, essentially all of which driving circuits are formed in a single array in the lateral direction along the driving circuit and adjacent to said output pad array in parallel to make the width of the driving circuit array substantially equal to the length of the driving circuit, and
   a control circuit with a substantially constant control circuit width which is formed between said driving circuit array and said input pad array, and adjacent and parallel to said driving circuit array from a driving circuit at one end of said driving circuit array to another driving circuit at the other end.

2. A semiconductor device claimed in claim 1, wherein said display is a liquid crystal display.

3. A semiconductor device claimed in claim 1, wherein the width of said driving circuit array and the width of said control circuit are formed in such a manner that their sum is substantially constant on the longer side of said chip.

4. A semiconductor device claimed in claim 1, wherein the length of said input wiring is formed to be shorter than the length of said output wiring.

5. A semiconductor device claimed in claim 1, wherein an output wiring extension of an additional output wiring array is formed between said substrate intermediate side and said chip intermediate side in said chip mounting section.

6. A semiconductor device claimed in claim 5, wherein the output wiring extension length of said output wiring extension is formed at substantially the same length or less as that of said output wiring.

7. A semiconductor device claimed in claim 1, wherein the pitch of said input wiring array is formed substantially the same as said input pad pitch, and the pitch of said output wiring array is substantially the same as said output pad pitch.

8. A semiconductor device as in claim 1, wherein the ratio of the length of said chip to its width (Lc/Wc) is four or more.

9. A single rectangular semiconductor IC chip, having a chip input side and a chip output side on its longer side, and a chip intermediate side on its shorter side, mounted on the center section of a single film substrate connected to display electrodes surrounding a liquid crystal display and comprising:

(a) an input pad array adjacent and parallel to said chip input side and having a substantially constant input pad pitch, (b) an output pad array adjacent and parallel to said chip output side and having a substantially constant output pad pitch smaller than said input pad pitch, (c) a driving circuit array including a plurality of driving circuits with a pitch smaller than said output pad pitch, essentially all of which driving circuits are formed in a single array in the lateral direction along the driving circuit and adjacent to said output pad array in parallel to make the width of said driving circuit array substantially equal to the length of the driving circuit, and (d) a control circuit with a substantially constant control circuit width which is formed between said driving circuit array and said input pad array, and adjacent and parallel to said driving circuit array from a driving circuit at one end of said driving circuit array to another driving circuit at the other end.

10. A single semiconductor IC chip claimed in claim 9, wherein an additional output pad array is formed between said chip intermediate side, and said driving circuit array and said control circuit, and parallel and adjacent to said chip intermediate side.

11. A single semiconductor IC chip claimed in claim 9, wherein the width of said driving circuit array and the width of said control circuit are formed in such a manner that their sum is substantially constant at the longer side of said chip.

12. A single semiconductor IC chip claimed in claim 9, wherein the ratio of the length of said chip to its width (Lc/Wc) is four or more.

* * * * *